(12) United States Patent
Yoshino et al.

(10) Patent No.: US 7,367,116 B2
(45) Date of Patent: May 6, 2008

(54) MULTI-LAYER PRINTED CIRCUIT BOARD, AND METHOD FOR FABRICATING THE SAME

(75) Inventors: Toyokazu Yoshino, Fukuoka (JP); Kouji Nakashima, Onga-gun (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 155 days.

(21) Appl. No.: 10/891,190

(22) Filed: Jul. 15, 2004

(65) Prior Publication Data

US 2005/0011677 A1   Jan. 20, 2005

(30) Foreign Application Priority Data

Jul. 16, 2003  (JP) .............................. 2003-197577
Oct. 29, 2003  (JP) .............................. 2003-368668

(51) Int. Cl.
  H05K 3/36   (2006.01)
  H05K 3/00   (2006.01)
  H01R 9/00   (2006.01)

(52) U.S. Cl. .............................. 29/830; 29/843; 29/845

(58) Field of Classification Search ................ 174/254, 174/262–266; 361/749–752; 29/830, 842–845
See application file for complete search history.

(56) References Cited

U.S. PATENT DOCUMENTS 4,644,643 A  *  2/1987 Sudo ........................... 29/845
5,401,911 A  *  3/1995 Anderson et al. ............. 174/262
5,600,099 A  *  2/1997 Crotzer et al. ................ 174/257
5,971,253 A  * 10/1999 Gilleo et al. ............ 228/180.22
6,015,607 A  *  1/2000 Fraivillig ..................... 428/214
6,087,597 A  *  7/2000 Shimada et al. .............. 174/263
6,320,140 B1 * 11/2001 Enomoto ...................... 174/264
6,818,839 B2 * 11/2004 Hosaka et al. ................ 174/262
6,831,236 B2 * 12/2004 Higuchi et al. ............... 174/264
2001/0004944 A1 *  6/2001 Nakamura et al. ........... 174/262
2004/0094837 A1 *  5/2004 Greer ........................... 257/737

FOREIGN PATENT DOCUMENTS

JP    5175636    7/1993
JP    7176847    7/1995

* cited by examiner

Primary Examiner—Jeremy C Norris
(74) Attorney, Agent, or Firm—Dickinson Wright, PLLC

(57) ABSTRACT

To provide an interlayer-connected, multi-layer flexible printed circuit board having high bonding reliability and most suitable for micropatterning the circuit layers in the device; and to provide a high-productivity method for fabricating the device.

A multi-layer flexible printed circuit board, wherein a conductor is filled in the through-holes formed in the insulating layer in the direction of the thickness thereof so as to electrically interconnect the circuit layers formed on both faces of the insulating layer, and wherein the conductor contains inside it, a copper-core solder ball having a copper ball as a core thereof.

4 Claims, 8 Drawing Sheets

(a)

(b)

(c)

(d)

(e)

(a)

(b)

(c)

(d)

(e)

(a)

(b)

(a)

(b)

(c)

(d)

(e)

(a)

(b)

(c)

(d)

(e)

(a)

(b)

MULTI-LAYER PRINTED CIRCUIT BOARD, AND METHOD FOR FABRICATING THE SAME

BACKGROUND OF THE INVENTION

1. Field of the Invention

The present invention relates to a flexible printed circuit board with various SMT (surface mount technology) chips mounted on the surface thereof, in particular, to such a multi-layer flexible printed circuit board of high bonding reliability and to a method for fabricating it.

2. Description of the Related Art

The recent tendency in the art toward down-sized, light-weight and multi-function electronic appliances brings about further increase in the circuit density of the flexible printed circuit board (hereinafter this may be abbreviated to FPC) to be used in such appliances. There is a limit of micropatterning technology to the increase in the circuit density of FPC. Accordingly, multi-layer FPC is now specifically noticed, which comprises multiple circuit layers laminated and in which the multiple circuit layers are three-dimensionally interconnected through insulating layers that are interconnectably disposed between them, to thereby increase the circuit density of the thus-constructed multi-layer FPC.

Heretofore, multi-layer FPC is fabricated by forming through-holes in an insulating layer of polyimide film and plating the sidewall face of the through-holes with copper to thereby three-dimensionally interconnect the circuit layers on both faces of the insulating layer (for example, see JP-A 5-175636 (page 2, FIG. 2)). The interlayer connecting method is referred to as a plated through-hole method, and it is most popular for interconnection in multi-layer FPC. The fabrication method comprises two significant steps: one is for electroless-plating the wall face of insulating through-holes to make them conductive, and the other is for electrolytic-plating it with a thick layer of copper. One characteristic advantage of the method is that, since the thermal expansion coefficient of the copper plate film inside the through-holes is nearly the same as that of the insulating layer with the through-holes formed therein, the bonding reliability to heat of the devices fabricated is good.

However, the thick plating with copper shall increase not only the thickness of the copper plate film inside the through-holes but also the thickness of the copper foil to be a circuit layer, therefore making it difficult to etch the foil for micropatterning to give the intended circuit layer. There are still other problems in that the process of the method is long and the productivity thereof is low.

To solve the problems with the interconnection technology, another method is proposed, which comprises printing the inner wall face of through-holes with a solder paste and fusing and solidifying the paste thereon (for example, see JP-A 7-176847 (pages 2-4, FIG. 2)). The method is characterized in that its process is simple as compared with the plated through-hole method mentioned above and therefore its productivity is high, and, in addition, since the circuit layers are interconnected after they are formed, the process of the method does not have any influence on the thickness of the copper foil and therefore does not interfere with the micropatterning of the circuit layers.

In the method, however, the thermal expansion coefficient of solder is larger than that of the insulating layer, and when heated, the solder in the through-holes may expand more than the insulating layer and there may be a risk that the bonding interface between the circuit layer on the insulating layer and the solder may peel off. To that effect, the soldering method is problematic in that the bonding reliability to heat of the devices fabricated therein is not good.

As mentioned above, the plated through-hole method in the related art for interlayer connection in multi-layer FPC is still problematic in point of the micropatterning of the circuit layers and of the productivity, though the bonding reliability of the devices fabricated therein is good. On the other hand, the soldering method is also problematic in point of the bonding reliability of the devices fabricated thereon, though it solves the problems with the former method in point of the micropatterning of the circuit layers and of the productivity.

Accordingly, in the art of interlayer connection in multi-layer FPC, a method of fabricating multi-layer FPC is desired that satisfies both good bonding reliability and good micropatterning of circuit layers and enables good productivity.

SUMMARY OF THE INVENTION

With the above-mentioned problems taken into consideration, an object of the invention is to provide an interconnected, multi-layer flexible printed circuit board that satisfies both good bonding reliability and good micropatterning of circuit layers and enables good productivity, and to provide a method for fabricating it.

To solve the problems mentioned above, the invention provides a multi-layer flexible printed circuit board that has a conductor filled in the through-holes formed in the insulating layer in the direction of the thickness thereof so as to electrically interconnect the circuit layers formed on both faces of the insulating layer, wherein the conductor contains inside it, a copper-core solder ball having a copper ball as a core thereof.

Also to solve the problems, the invention provides a method for fabricating the multi-layer flexible printed circuit board as above, which comprises forming through-holes in the interconnection sites of a double-printed circuit board having a printed circuit layer formed on both faces of an insulating layer in such a manner that the through-holes pass through the printed circuit layers and the insulating layer, then filling the through-holes each with a copper-core solder ball, and fusing the copper-core solder balls to thereby electrically interconnect the circuit layers to each other.

Since copper-core solder balls are used for the conductor for interlayer connection in the invention, the thermal expansion coefficient of the conductor may be optimized to realize high bonding reliability of the devices fabricated herein. In the fabrication method of the invention, since the printed circuit layers are interconnected after they are formed, the process of the method does not have any influence on the circuit layers at all, and the method therefore enables good micropatterning of the circuit layers. In addition, since the interlayer connection is attained by an extremely simple process of filling each through-hole with a copper-core solder ball followed by fusing the ball, the method ensures good productivity.

To solve the problems mentioned above, the invention provides a multi-layer flexible printed circuit board that has a conductor filled in the through-holes formed in the insulating layer in the direction of the thickness thereof so as to electrically interconnect the circuit layers formed on both faces of the insulating layer, wherein the conductor comprises solder and metal particles differing from the solder composition.

Also to solve the problems, the invention provides a method for fabricating the multi-layer flexible printed circuit board as above, which comprises forming through-holes in the interconnection sites of a double-printed circuit board having a printed circuit layer formed on both faces of an insulating layer in such a manner that the through-holes pass through the printed circuit layers and the insulating layer, then filling the through-holes each with a composite paste that comprises solder particles and metal particles of which the composition differs from that of the solder particles, and fusing the solder particles to thereby electrically interconnect the circuit layers to each other.

Since such a composite comprising solder and different metal particles is used for the conductor for interlayer connection in the invention, the thermal expansion coefficient of the conductor may be optimized to realize high bonding reliability of the devices fabricated herein.

In the fabrication method of the invention, since the printed circuit layers are interconnected after they are formed, the process of the method does not have any influence on the circuit layers at all, and the method therefore enables good micropatterning of the circuit layers. In addition, since the interlayer connection is attained by an extremely simple process of filling each through-hole with a composite paste that comprises solder particles and different metal particles followed by fusing the solder particles, the method ensures good productivity.

DESCRIPTION OF THE PREFREED EMBODIMENTS

Figure 1:
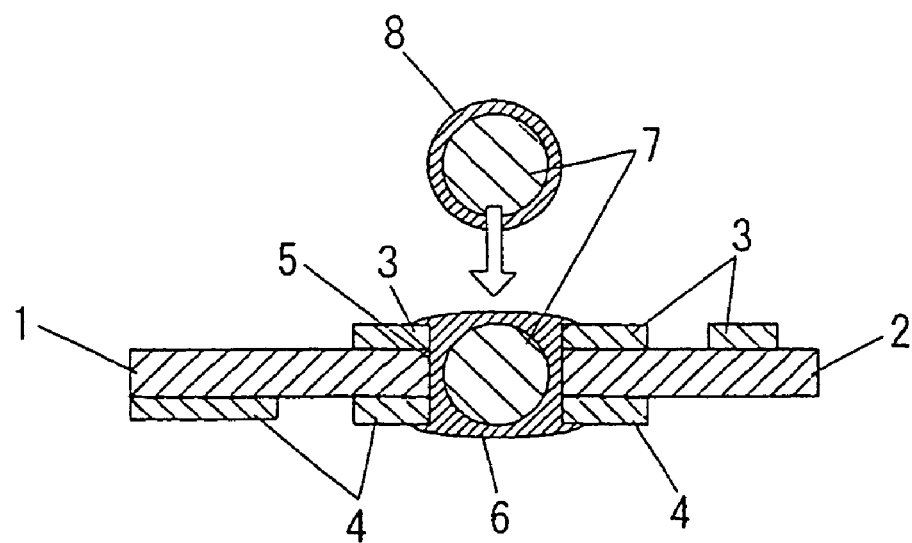
FIG. 1 is a cross-sectional view of an essential part of one embodiment of the multi-layer flexible printed circuit board of the invention.

The invention is a multi-layer flexible printed circuit board, wherein a conductor is filled in the through-holes formed in the insulating layer in the direction of the thickness thereof so as to electrically interconnect the circuit layers formed on both faces of the insulating layer, and wherein the conductor contains inside it, a copper-core solder ball having a copper ball as a core thereof. In this constitution, a copper ball is used for the core of the solder ball that serves as a conductor for interlayer connection, and its advantage is that the thermal expansion coefficient of the conductor may be lowered to the level of the thermal expansion coefficient of the insulating layer.

The invention is a multi-layer flexible printed circuit board, wherein a conductor is filled in the through-holes formed in the insulating layer in the direction of the thickness thereof so as to electrically interconnect the circuit layers formed on both faces of the insulating layer, and wherein the conductor contains inside it, a resin-core solder ball having a resin ball as a core thereof. In this constitution, a resin ball is used for the core of the solder ball that serves as a conductor for interlayer connection, and its advantage is that the Young's modulus of the conductor may be lowered and the conductor may therefore relieve the stress that may be caused by the thermal expansion difference between the insulating layer and the conductor.

The invention is a method for fabricating a multi-layer flexible printed circuit board, which comprises forming through-holes in the interconnection sites of a double-printed circuit board having a printed circuit layer formed on both faces of an insulating layer in such a manner that the through-holes pass through the printed circuit layers and the insulating layer, then filling the through-holes each with a copper-core solder ball, and fusing the copper-core solder balls to thereby electrically interconnect the circuit layers to each other. In this constitution, the printed circuit layers are interconnected to each other after they are formed, and the process of interconnecting them does not have any influence on the circuit layers at all. In this, in addition, since copper-core solder balls are used, the interlayer connection may be attained with them, according to the extremely simple process of filling the through-holes with the balls and fusing them therein, and its advantage is that the number of the steps of constituting the process may be reduced.

The Invention is subsidiary to the method for fabricating a multi-layer flexible printed circuit board as above, in which the double-printed circuit board is formed by bonding two single-printed circuit boards each having a printed circuit layer formed on one face of an insulating layer, via an adhesive layer therebetween in such a manner that the circuit layer is the outermost layer. In this constitution, the printed circuit layer may be micropatterned more readily in the single-printed circuit board than in a double-printed circuit board. In this, such two single-printed circuit boards are bonded to give a double-printed circuit board, and its advantage is that the printed circuit layers on the double-printed circuit board may be micropatterned to a higher degree.

The invention is a method for fabricating a multi-layer flexible printed circuit board, which comprises forming through-holes in the interconnection sites of a single-printed circuit board having a printed circuit layer formed on one face of an insulating layer in such a manner that the through-holes pass through the printed circuit layer and the insulating layer, laminating the thus-processed single-printed circuit board on the circuit layer-having face of another single-printed circuit board in such a manner that the circuit layer of the former board is the outermost layer, via an adhesive layer therebetween to thereby form blind via-holes in the laminate structure, then putting a copper-core solder ball in each blind via-hole, and fusing the copper-core solder balls to thereby electrically interconnect the circuit layers to each other. In this constitution, a copper-core solder ball is put into the non-through blind via-holes each bottomed with the underlying circuit layer, and fused and solidified therein to attain electric interconnection of the laminated circuit layers. Therefore, the advantage of this constitution is that the bonding area between the conductor and the circuit layer increases as compared with the other constitutions mentioned above where the conductor is filled into through-holes, and the bonding strength between the two therefore increases.

The invention is subsidiary to the method for fabricating a multi-layer flexible printed circuit board as above, in which a plurality of the multi-layer flexible printed circuit boards are laminated via an adhesive layer therebetween. In this constitution, a plurality of the multi-layer flexible printed circuit boards having high bonding reliability and having micropatterned printed circuit layers are further laminated, and its advantage is that the number of the printed circuit layers of the multi-layer flexible printed circuit boards having high bonding reliability and having micropatterned printed circuit layers may be increased.

The invention is subsidiary to the method for fabricating a multi-layer flexible printed circuit board as above, in which the copper-core solder ball is a resin-core solder ball. The advantage of this constitution is that the thermal expansion coefficient and the Young's modulus of the conductor for interlayer connection may be optimized.

The invention is a multi-layer flexible printed circuit board, wherein a conductor is filled in the through-holes formed in the insulating layer in the direction of the thickness thereof so as to electrically interconnect the circuit layers formed on both faces of the insulating layer, and wherein the conductor comprises solder and metal particles differing from the solder composition. In this constitution, different metal particles are used for the solder conductor for interlayer connection, and its advantage is that the thermal expansion coefficient of the conductor may be lowered to the level of the thermal expansion coefficient of the insulating layer.

The invention is subsidiary to the multi-layer flexible printed circuit board, wherein the metal particles are inside the solder. In this constitution, the thermal expansion coefficient of the conductor may be exactly controlled, and its advantage is that, even when the bondability to the circuit layer of the metal particles used is lower than that of solder, the solder bonding is still good since solder of good bondability covers the metal particles.

The invention is a multi-layer flexible printed circuit board, wherein a conductor is filled in the through-holes formed in the insulating layer in the direction of the thickness thereof so as to electrically interconnect the circuit layers formed on both faces of the insulating layer, and wherein the conductor comprises solder and resin particles. In this constitution, resin particles are used for the solder conductor for interlayer connection, and its advantage is that the Young's modulus of the conductor may be lowered and the conductor may therefore relieve the stress that may be caused by the thermal expansion difference between the insulating layer and the conductor.

The invention is subsidiary to the multi-layer flexible printed circuit board as above, wherein the resin particles are inside the solder. In this constitution, the Young's modulus of the conductor may be exactly controlled, and its advantage is that, even though the resin particles not participating in bonding to the circuit layer are used, the solder bonding is still good since solder of good bondability covers the resin particles.

The invention is a multi-layer flexible printed circuit board, wherein a conductor is filled in the through-holes formed in the insulating layer in the direction of the thickness thereof so as to electrically interconnect the circuit layers formed on both faces of the insulating layer, and wherein the conductor comprises solder, metal particles differing from the solder composition, and resin particles. In this constitution, different metal particles and resin particles are used for the solder conductor for interlayer connection, and its advantage is that the thermal expansion coefficient of the conductor may be lowered to the level of the thermal expansion coefficient of the insulating layer, the Young's modulus of the conductor may be lowered, and the conductor may relieve the stress that may be caused by the thermal expansion difference between the insulating layer and the conductor.

The invention is subsidiary to the multi-layer flexible printed circuit board as above, wherein the metal particles and the resin particles are inside the solder. In this constitution, the thermal expansion coefficient and the Young's modulus of the conductor may be exactly controlled, and its advantage is that, even when the bondability to the circuit layer of the metal particles used is lower than that of solder and even though the resin particles not participating in bonding to the circuit layer are used, the solder bonding is still good since solder of good bondability covers the metal particles and the resin particles.

The invention is a method for fabricating a multi-layer FPC, which comprises forming through-holes in the interconnection sites of a double-printed circuit board having a printed circuit layer formed on both faces of an insulating layer in such a manner that the through-holes pass through the printed circuit layers and the insulating layer, then filling the through-holes each with a composite paste that comprises solder particles and metal particles of which the composition differs from that of the solder particles, and fusing the solder particles to thereby electrically interconnect the circuit layers to each other. In this constitution, the printed circuit layers are interconnected to each other after they are formed, and the process of interconnecting them does not have any influence on the circuit layers at all. In this, in addition, since a composite paste comprising solder particles and different metal particles is used, the interlayer connection may be attained with it, according to the extremely simple process of filling the through-holes each with the paste and fusing it therein, and its advantage is that the number of the steps of constituting the process may be reduced. Another advantage thereof is that the thermal expansion coefficient of the conductor for interlayer connection may be optimized.

The invention is a method for fabricating a multi-layer FPC, which comprises forming through-holes in the interconnection sites of a double-printed circuit board having a printed circuit layer formed on both faces of an insulating layer in such a manner that the through-holes pass through the printed circuit layers and the insulating layer, then filling the through-holes each with a composite paste that comprises solder particles and resin particles, and fusing the solder particles to thereby electrically interconnect the circuit layers to each other. In this constitution, the printed circuit layers are interconnected to each other after they are formed, and the process of interconnecting them does not have any influence on the circuit layers at all. In this, in addition, since a composite paste comprising solder particles and resin particles is used, the interlayer connection may be attained with it, according to the extremely simple process of filling the through-holes each with the paste and fusing it therein, and its advantage is that the number of the steps of constituting the process may be reduced. Another advantage thereof is that the Young's modulus of the conductor for interlayer connection may be optimized.

The invention is a method for fabricating a multi-layer FPC, which comprises forming through-holes in the interconnection sites of a double-printed circuit board having a printed circuit layer formed on both faces of an insulating layer in such a manner that the through-holes pass through the printed circuit layers and the insulating layer, then filling the through-holes each with a composite paste that comprises solder particles, metal particles of which the composition differs from that of the solder particles, and resin particles, and fusing the solder particles to thereby electrically interconnect the circuit layers to each other. In this constitution, the printed circuit layers are interconnected to each other after they are formed, and the process of interconnecting them does not have any influence on the circuit layers at all. In this, in addition, since a composite paste comprising solder particles, different metal particles and resin particles is used, the interlayer connection may be attained with it, according to the extremely simple process of filling the through-holes each with the paste and fusing it therein, and its advantage is that the number of the steps of constituting the process may be reduced. Another advantage thereof is that the thermal expansion coefficient and the Young's modulus of the conductor for interlayer connection may be optimized.

The invention is subsidiary to the method for fabricating a multi-layer FPC as above, wherein the double-printed circuit board is formed by bonding two single-printed circuit boards each having a printed circuit layer formed on one face of an insulating layer, via an adhesive layer therebetween in such a manner that the circuit layer is the outermost layer. In this constitution, the printed circuit layer may be micropatterned more readily in the single-printed circuit board than in a double-printed circuit board. In this, such two single-printed circuit boards are bonded to give a double-printed circuit board, and its advantage is that the printed circuit layers on the double-printed circuit board may be micropatterned to a higher degree.

The invention is a method for fabricating a multi-layer FPC, which comprises forming through-holes in the interconnection sites of a single-printed circuit board having a printed circuit layer formed on one face of an insulating layer in such a manner that the through-holes pass through the printed circuit layer and the insulating layer, laminating the thus-processed single-printed circuit board on the circuit layer-having face of another single-printed circuit board in such a manner that the circuit layer of the former board is the outermost layer, via an adhesive layer therebetween to thereby form blind via-holes in the laminate structure, then filling the blind via-holes each with a composite paste that comprises solder particles and metal particles of which the composition differs from that of the solder particles, and fusing the solder particles to thereby electrically interconnect the circuit layers to each other. In this constitution, a composite paste comprising solder particles and different metal particles is filled into the non-through blind via-holes each bottomed with the underlying circuit layer, and fused and solidified therein to attain electric interconnection of the laminated circuit layers. Therefore, the advantage of this constitution is that the bonding area between the conductor and the circuit layer increases as compared with the other constitutions mentioned above where the conductor is filled into through-holes, and the bonding strength between the two therefore increases. Another advantage thereof is that the thermal expansion coefficient of the conductor for interlayer connection may be optimized.

The invention is a method for fabricating a multi-layer FPC, which comprises forming through-holes in the interconnection sites of a single-printed circuit board having a printed circuit layer formed on one face of an insulating layer in such a manner that the through-holes pass through the printed circuit layer and the insulating layer, laminating the thus-processed single-printed circuit board on the circuit layer-having face of another single-printed circuit board in such a manner that the circuit layer of the former board is the outermost layer, via an adhesive layer therebetween to thereby form blind via-holes in the laminate structure, then filling the blind via-holes each with a composite paste that comprises solder particles and resin particles, and fusing the solder particles to thereby electrically interconnect the circuit layers to each other. In this constitution, a composite paste comprising solder particles and resin particles is filled into the non-through blind via-holes each bottomed with the underlying circuit layer, and fused and solidified therein to attain electric interconnection of the laminated circuit layers. Therefore, the advantage of this constitution is that the bonding area between the conductor and the circuit layer increases as compared with the other constitutions mentioned above where the conductor is filled into through-holes, and the bonding strength between the two therefore increases. Another advantage thereof is that the Young's modulus of the conductor for interlayer connection may be optimized.

The invention is a method for fabricating a multi-layer FPC, which comprises forming through-holes in the interconnection sites of a single-printed circuit board having a printed circuit layer formed on one face of an insulating layer in such a manner that the through-holes pass through the printed circuit layer and the insulating layer, laminating the thus-processed single-printed circuit board on the circuit layer-having face of another single-printed circuit board in such a manner that the circuit layer of the former board is the outermost layer, via an adhesive layer therebetween to thereby form blind via-holes in the laminate structure, then filling the blind via-holes each with a composite paste that comprises solder particles, metal particles of which the composition differs from that of the solder particles, and resin particles, and fusing the solder particles to thereby electrically interconnect the circuit layers to each other. In this constitution, a composite paste comprising solder particles, different metal particles and resin particles is filled into the non-through blind via-holes each bottomed with the underlying circuit layer, and fused and solidified therein to attain electric interconnection of the laminated circuit layers. Therefore, the advantage of this constitution is that the bonding area between the conductor and the circuit layer increases as compared with the other constitutions mentioned above where the conductor is filled into through-holes, and the bonding strength between the two therefore increases. Another advantage thereof is that the thermal expansion coefficient and the Young's modulus of the conductor for interlayer connection may be optimized.

The invention is subsidiary to the method for fabricating a multi-layer FPC as above, wherein a plurality of the multi-layer flexible printed circuit boards are laminated via an adhesive layer therebetween. In this constitution, a plurality of the multi-layer flexible printed circuit boards having high bonding reliability and having micropatterned printed circuit layers are further laminated, and its advantage is that the number of the printed circuit layers of the multi-layer flexible printed circuit boards having high bonding reliability and having micropatterned printed circuit layers may be increased.

Some embodiments of the invention are described hereinunder with reference to FIG. 1 to FIG. 4 attached hereto. In these drawings, the same member is designated by the same reference numeral, and redundant descriptions are omitted. The data as referred to in the embodiments are to indicate examples of all and various possible cases, and should not be limitative.

Embodiment 1

Some embodiments of the multi-layer flexible printed circuit board of the invention are described below.

FIG. 1 is referred to for describing the multi-layer flexible printed circuit board of the invention. FIG. 1 is a cross-sectional view showing an essential part of one embodiment of the multi-layer flexible printed circuit board of the invention.

In FIG. 1, 1 is a multi-layer FPC having an upper circuit layer 3 and a lower circuit layer 4 formed on both faces of an insulating layer of a polyimide film, in which the circuit layers are interconnected to each other via a conductor 6 filled inside the through-hole 5. The conductor 6 is formed through fusing and solidification of a copper-core solder ball 8 that has a copper ball 7 inside it. The solder composition of the copper-core solder ball 8 may be any of eutectic solder, high-temperature solder, lead-free solder or the like, and any of these is favorable to the invention and may be used herein in any desired manner.

As in FIG. 1, the conductor 6 that participates in the interconnection in the multi-layer FPC 1 is so designed that it has a copper ball 7 inside it. The copper-core solder ball 8 for the conductor 6 for interconnection in the device has a copper ball 7 as the core thereof, and the thermal expansion coefficient of the conductor 6 is therefore lowered to the level of the thermal expansion coefficient of the insulating layer 2. This solves the problem that has heretofore been most difficult to solve in the art of using solder for interlayer connection in that, when the conductor of solder alone is heated, then the solder in through-holes expands more than the insulating layer and the circuit layer on the surface of the insulating layer peels from the solder at the bonding interface between the two, and therefore the device could not ensure bonding reliability to heat. To that effect, the structure of the invention ensures high bonding reliability of the device.

As the core of the copper-core solder ball 8, a resin ball may also be used. This could not lower the thermal expansion coefficient of the conductor 6, but is effective for lowering the Young's modulus of the conductor 6. Accordingly, the conductor 6 can relieve the stress that may be caused by the thermal expansion difference between the insulating layer 2 and the conductor 6, and therefore this structure ensures high bonding reliability of the device.

Figure 2:
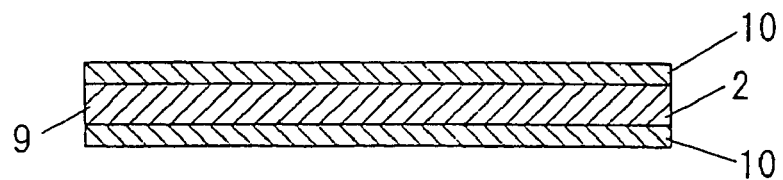
FIG. 2(a) is a cross-sectional view of an essential part of a copper-duplicated laminate plate that serves as a starting material in one embodiment of the invention; (b) is a cross-sectional view of an essential part of a double-printed circuit board having a printed circuit layer on both faces thereof in one embodiment of the invention; (c) is a cross-sectional view of an essential part of the double-printed circuit board having a through-hole formed therein in one embodiment of the invention; (d) is a cross-sectional view of an essential part of the double-printed circuit board where the through-hole is filled with a copper-core solder ball in one embodiment of the invention, (e) is a cross-sectional view of an essential part of a multi-layered flexible printed circuit board after interlayer connection in one embodiment of the invention.
Figure 2:
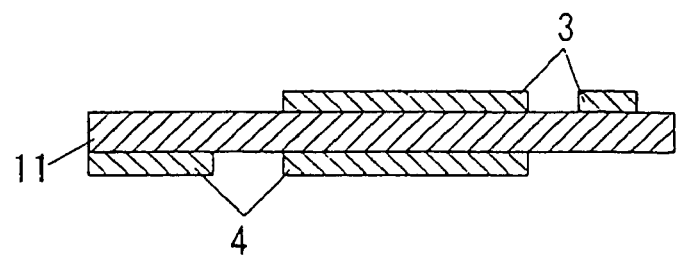
Figure 2:
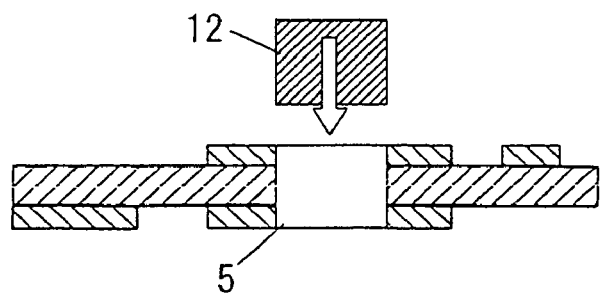
Figure 2:
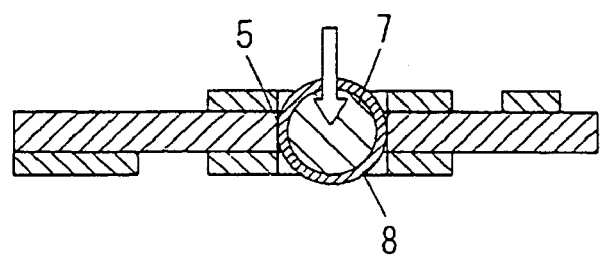
Figure 2:
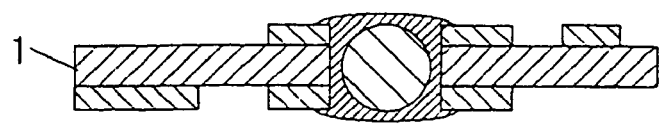
Figure 3:
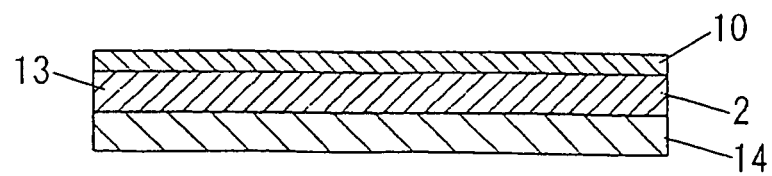
FIG. 3(a) is a cross-sectional view of an essential part of an adhesive layer-lined, copper single-sided laminate plate that serves as a starting material in another embodiment of the invention; (b) is a cross-sectional view of an essential part of an adhesive layer-lined, single-printed circuit board having a printed circuit layer on one face thereof in the second embodiment of the invention; 3(c) is a cross-sectional view of an essential part of the adhesive layer-lined, single-printed circuit board having a blind via-hole formed therein in the second embodiment of the invention; (d) is a cross-sectional view of an essential part of a laminated circuit board formed by laminating the adhesive layer-lined, single-printed circuit board on another laminate in the second embodiment of the invention; 3(e) is a cross-sectional view of an essential part of a multi-layered flexible printed circuit board after interlayer connection in the second embodiment of the invention.
Figure 3:
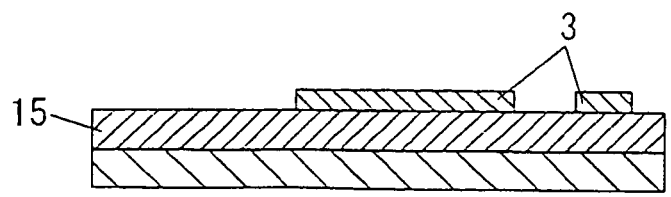
Figure 3:
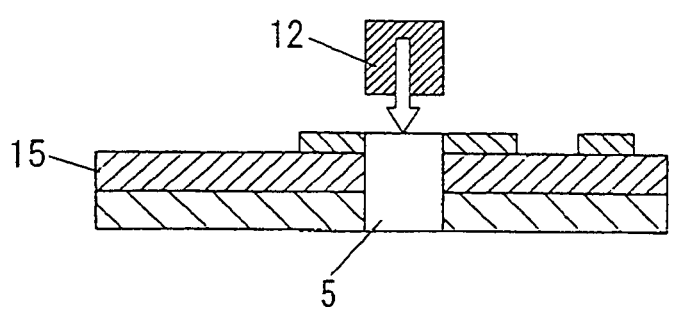
Figure 3:
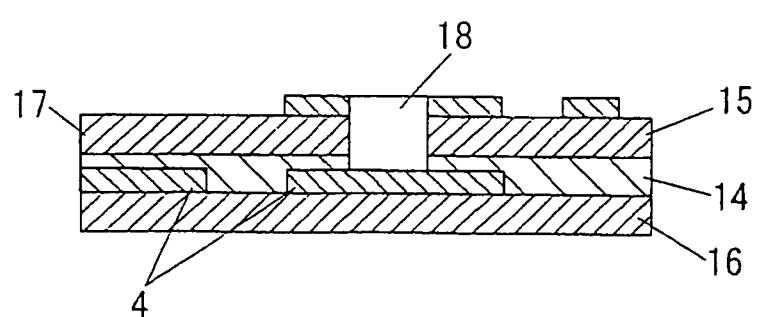
Figure 3:
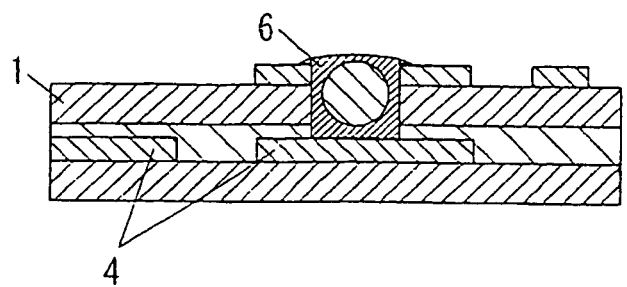
Figure 4:
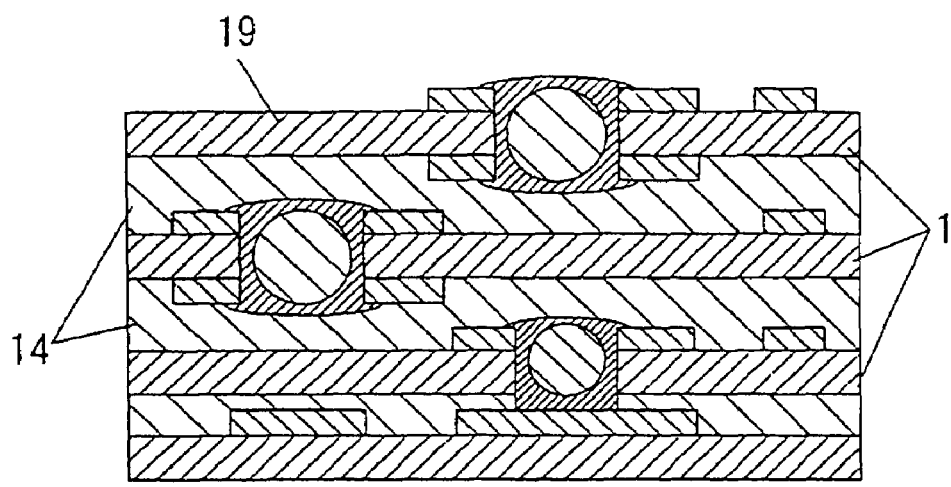
FIG. 4(a) is a cross-sectional view of an essential part of one embodiment of a laminated, multi-layer flexible printed circuit board of the invention; (b) is a cross-sectional view of an essential part of another embodiment of a laminated, multi-layer flexible printed circuit board of the invention.
Figure 4:
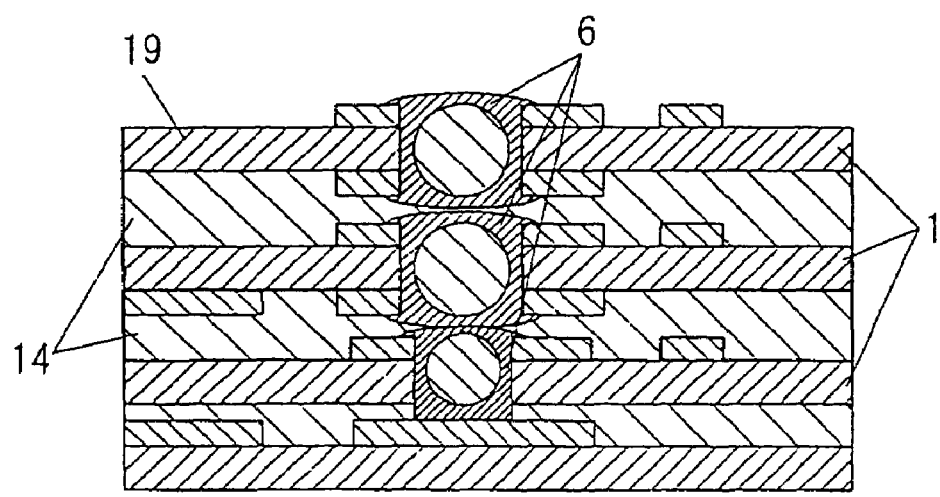

A method for fabricating the multi-layer flexible printed circuit board that comprises such copper-core solder balls and has such high bonding reliability is described in more detail with reference to FIG. 2, FIG. 3 and FIG. 4. In FIG. 2, FIG. 3 and FIG. 4, the same reference numerals as in FIG. 1 are basically the same also in those, and their description is omitted herein.

One embodiment of the method for fabricating the multi-layer flexible print circuit board of the invention is described with reference to FIG. 2. FIG. 2(*a*) is a cross-sectional view of an essential part of a copper-duplicated laminate plate that serves as a starting material in one embodiment of the invention; FIG. 2(*b*) is a cross-sectional view of an essential part of a double-printed circuit board having a printed circuit layer on both faces thereof in one embodiment of the invention; FIG. 2(*c*) is a cross-sectional view of an essential part of the double-printed circuit board having a through-hole formed therein in one embodiment of the invention; FIG. 2(*d*) is a cross-sectional view of an essential part of the double-printed circuit board where the through-hole is filled with a copper-core solder ball in one embodiment of the invention; and FIG. 2(*e*) is a cross-sectional view of an essential part of a multi-layered flexible printed circuit board after interlayer connection in one embodiment of the invention.

In FIG. 2, 9 is a copper-duplicated laminate plate with copper foil 10 directly formed on both faces of an insulating layer 2. 11 is a double-printed circuit board having a circuit layer formed on both faces thereof through etching treatment of the copper-duplicated laminate plate 9. 12 is a punching die for forming a through-hole.

First as in FIG. 2(a), a copper-duplicated laminate plate 9 is prepared, which has copper foil 10 directly formed on both faces of an insulating layer 2. This embodiment of the invention is a two-layered structure with no adhesive layer formed between the insulating layer 2 and the copper foil 10. Apart from it, the invention may also apply to a three-layered structure having an adhesive layer between the two layers. Any of these structures may be suitably selected in any desired manner, and the invention should not be limited to these.

Next, a mask is formed on the surface of the copper foil 10, which is then etched with an etchant for copper, such as iron chloride, copper chloride or the like to thereby form the upper circuit layer 3 and the lower circuit layer 4, as in FIG. 2(b). The circuit layers thus formed in this step are not influenced at all by the subsequent steps. Accordingly, in this embodiment of fabricating the multi-layer FPC of the invention, the circuit layer may be micropatterned as fine as possible by thinning the copper foil 10 in this step.

Next as in FIG. 2(c), a through-hole 5 is formed by punching with a punching die 12; and as in FIG. 2(d), a copper-core solder ball 8 is fitted into the through-hole 5. For fitting the copper-core solder ball 8 into it, for example, employable is a known method of mounting solder balls on a semiconductor package, BGA. Concretely, a suction plate having, formed therein, a through-hole smaller than the diameter of the solder ball is prepared in the position that corresponds to the through-hole into which the solder ball is to be fitted, and this is connected with a vacuum pump for controlling the pressure in the through-hole of the plate. Using the suction plate, a solder ball is fitted to the suction mouth, registered above the through-hole, and dropped into it, and the solder ball is thereby fitted into the through-hole. A ball mounter capable of attaining the operation as above may also be used. In this embodiment, the solder ball is mounted and fitted into the through-hole in a mode of vacuum suction. Not limited to it, however, any other method of electrostatic suction or the like may also be employed herein. In this embodiment, the copper-core solder ball 8 is used and this is fitted into the through-hole 5. Apart from it, a resin-core solder ball having a resin ball as the core thereof may also be used, and it also ensures high bonding reliability. Any of these modes may be suitably selected and employed in the invention, to which, however, the invention should not be limited.

Last, the copper-core solder ball 8 is fused under heat and solidified to give the interlayer-connected, multi-layer FPC 1, as in FIG. 2(e). The process of fabricating it is extremely simple.

The embodiment of the method for fabricating the multi-layer flexible printed circuit board of the invention mentioned above is characterized by the following: Since the conductor for interlayer connection has a copper ball inside it, it ensures high bonding reliability. In addition, since the interlayer connection is attained after the formation of the circuit layers, the process of fabricating the device has no influence on the circuit layers. Therefore, the process is favorable for micropatterning of the circuit layers in any desired manner. Last, since copper-core solder balls are used for the interlayer bonding material in the process, an extremely simple operation of fitting the balls into through-holes followed by fusing them therein enables the intended interlayer connection. The number of the necessary steps for the interlayer connection in this method may be reduced as compared with that in any other interconnection methods, and the productivity of the method of the invention is significantly improved. Accordingly, the invention provides an interlayer-connected, multi-layer flexible printed circuit board having high bonding reliability and is most suitable for micropatterning the circuit layers in the device, and the productivity in the method for fabricating the device is high.

Another embodiment of the method for fabricating the multi-layer flexible printed circuit board of the invention is described below, with reference to FIG. 3. This also has the advantages of bonding reliability and micropatterning of circuit layers. FIG. 3(a) is a cross-sectional view of an essential part of an adhesive layer-lined, copper single-sided laminate plate that serves as a starting material in the second embodiment of the invention; FIG. 3(b) is a cross-sectional view of an essential part of an adhesive layer-lined, single-printed circuit board having a printed circuit layer on one face thereof in the second embodiment of the invention; FIG. 3(c) is a cross-sectional view of an essential part of the adhesive layer-lined, single-printed circuit board having a blind via-hole formed therein in the second embodiment of the invention; FIG. 3(d) is a cross-sectional view of an essential part of a laminated circuit board formed by laminating the adhesive layer-lined, single-printed circuit board on another laminate in the second embodiment of the invention; and FIG. 3(e) is a cross-sectional view of an essential part of a multi-layered flexible printed circuit board after interlayer connection in the second embodiment of the invention.

In FIG. 3, 13 is an adhesive layer-lined, copper single-sided laminate plate having copper foil 10 formed one face of an insulating layer 2 and having an adhesive layer 14 formed on the other face thereof. 15 is an adhesive layer-lined, single-printed circuit board having an upper circuit layer 3 formed on one face thereof through etching treatment of the adhesive layer-lined, copper single-sided laminate plate 13. 16 is another adhesive layer-lined, single-printed circuit board that is to be laminated with the adhesive layer-lined, single-printed circuit board 15. 17 is a laminated circuit board formed by laminating the adhesive layer-lined, single-printed circuit boards 15 and 16 followed by forming a blind via-hole 18 in the resulting laminate structure for interlayer connection through it.

First as in FIG. 3(a), an adhesive layer-lined, copper single-sided laminate plate 13 is prepared, which has copper foil 10 directly formed on one face of an insulating layer 2, and has an adhesive layer 14 formed on the other face thereof. This is etched to form an upper circuit layer 3 thereon, and an adhesive layer-lined, single-printed circuit board 15 is formed, as in FIG. 3(b). As compared with the circuit layer in the double-printed circuit board in the former embodiment as above, the upper circuit layer 3 in the adhesive layer-lined, single-printed circuit board 15 in this second embodiment may be micropatterned more finely since it accepts single-face etching that is more suitable for micropatterning to give circuits.

The reason is described below. In forming circuit layers of a double-printed circuit board, the copper foil existing on both faces of a copper-duplicated laminate plate is etched both at a time, and therefore, an etchant must be uniformly and evenly applied to both faces of the copper-duplicated laminate plate in the upward and downward two directions. However, when an etchant is sprayed under pressure onto both faces of a copper-duplicated laminate plate in the upward and downward two directions, then the etchant having been sprayed onto the upper face may remain as such thereon therefore causing a problem in that the etching uniformity could not be ensured. Accordingly, the etching condition for such double-printed circuit boards is unstable, and it will be difficult to form extremely finely-micropatterned circuit layers in these circuit boards. On the other hand, in forming a circuit layer of a single-printed circuit board, an etchant may be sprayed onto a single-sided plate only in the upward direction, and therefore no etchant may remain on the plate. Accordingly, the optimal range of the etching condition for it may be broadened, and it is favorable for finely micropatterning the circuit layer on the single-printed circuit board.

Next as in FIG. 3(c), a through-hole 5 is formed in the adhesive layer-lined, single-printed circuit board 15 by punching it with a punching die 12; and as in FIG. 3(d), the adhesive layer-lined, single-printed circuit board 15 is laminated with another single-printed circuit board 16 with a lower circuit layer 4 formed thereon, via the adhesive layer 14 therebetween to thereby construct a laminated circuit board 17 having a blind via-hole 18 formed therein for interlayer connection. Thus constructed, the laminated circuit board 17 has the single-printed circuit board having the finely-micropatterned circuit layer. Therefore, as compared with the circuit layers of the double-printed circuit board in the former embodiment mentioned above, the circuit layers of the single-printed circuit board of this embodiment may be much more finely micropatterned. In this embodiment of laminating the single-printed circuit boards as illustrated herein, the laminated circuit board 17 is used. Not limited to it and in place of it, however, a double-printed circuit board constructed by bonding two single-printed circuit boards to each other in such a manner that the circuit layer could be the outermost layer may also be used for micropatterning the circuit layers as fine as possible. In the invention, any of these lamination methods may be employed in any desired manner, and needless-to-say, the invention should not be limited to these.

Last as in FIG. 3(e), a copper-core solder ball is fitted into the blind via-hole 18 and fused therein for interlayer connection to give the intended multi-layer FPC 1 in which the circuit layers are extremely finely micropatterned. The conductor 6 for interlayer connection is filled inside the blind via-hole 18 that is bottomed with the underlying lower circuit layer 4. Therefore, as compared with the former embodiment having a through-hole as above, the bonding area between the conductor 6 and the circuit layer is increased in this embodiment, and the bonding strength between the two is therefore increased. Accordingly, even when various external stress is given to the circuit board of this embodiment, the circuit layer does not peel from the conductor 6 at the bonding interface between the two, and the device ensures further better bonding reliability.

In the second embodiment of fabricating the multi-layer flexible printed circuit board of the invention, single-printed circuit boards are laminated. In this, therefore, the circuit layers may be micropatterned more finely, as compared with those in the other embodiment mentioned hereinabove of forming double-printed circuit boards. In addition, since the conductor is filled into the blind via-holes in this embodiment, it ensures further better bonding reliability as compared with the other embodiment where the conductor is filled into through-holes. Accordingly, the second embodiment of the invention also provides an interlayer-connected, multi-layer flexible printed circuit board having high bonding reliability and is most suitable for micropatterning the circuit layers in the device, and the productivity in the method for fabricating the device is high.

Still another embodiment of the invention of further laminating the multi-layer flexible printed circuit boards fabricated previously is described below with reference to FIG. 4. This is to give laminate-structured, multi-layer flexible printed circuit boards. FIG. 4(a) is a cross-sectional view of an essential part of one embodiment of the laminated, multi-layer flexible printed circuit board of the invention; and FIG. 4(b) is a cross-sectional view of an essential part of another embodiment of the laminated, multi-layer flexible printed circuit board of the invention.

In FIG. 4, 19 is a laminated multi-layer FPC fabricated by laminating multi-layer FPCs 1 via an adhesive layer 14 therebetween.

As in FIG. 4(a), the multi-layer FPCs 1 fabricated according to any of the embodiments of the invention mentioned hereinabove are laminated via an adhesive layer 14 therebetween to give a multi-layer FPC 19 in which the number of the circuit layers is increased. In the multi-layer FPC 19 thus constructed, the constitutive multi-layer FPCs 1 all have good bonding reliability and finely-micropatterned circuit layers. Therefore, the multi-layer FPC 19 also has high bonding reliability and has finely-micropatterned circuit layers.

As in FIG. 4(b), the multi-layer FPCs 1 may be laminated in such a manner that the conductor 6 of one multi-layer FPC is kept in contact with that of the other multi-layer FPC, to construct a multi-layer FPC 19. Since the surface of the conductor 6 is solder, the solder may fuse and solidify when the conductors 6 are heated and cooled while they are kept in contact with each other, and as a result, the conductors 6 are readily bonded to each other.

The laminated, multi-layer flexible printed circuit boards of these embodiments of the invention are constructed by laminating the multi-layer flexible printed circuit boards fabricated in the other embodiments of the invention mentioned hereinabove. In these, the constitutive circuit boards have good bonding reliability and have finely-micropatterned circuit layers. Therefore, the laminated, multi-layer flexible printed circuit boards of the invention also have good bonding reliability and have finely-micropatterned circuit layers. Moreover, since the conductor of the constitutive multi-layer flexible printed circuit boards directly participates in interlayer connection of the circuit boards in constructing the laminated, multi-layer flexible printed circuit boards, not requiring any additional interlayer-connecting material, the productivity of the laminated, multi-layer flexible printed circuit boards is high. Accordingly, the invention also provides a laminated, interlayer-connected, multi-layer flexible printed circuit board having high bonding reliability and is most suitable for micropatterning the circuit layers in the device, and the productivity in the method for fabricating the device is high.

In the multi-layer flexible printed circuit board of the invention, a copper ball is used for the core of the conductor for interlayer connection, and its advantage is that the thermal expansion coefficient of the conductor may be optimized and the device ensures good bonding reliability.

In the multi-layer flexible printed circuit board of the invention, a resin ball is used for the core of the conductor for interlayer connection, and its advantage is that the Young's modulus of the conductor may be optimized and the device ensures good bonding reliability.

According to the method for fabricating a multi-layer flexible printed circuit board of the invention, interlayer connection is attained in an extremely simple process, and its advantage is that a multi-layer flexible printed circuit board having finely-micropatterned circuit layers can be fabricated at high productivity.

In the method for fabricating a multi-layer flexible printed circuit board of the invention, single-printed circuit boards each having an extremely finely-micropatterned circuit layer are processed, and its advantage is that the printed circuit layers on the double-printed circuit board thus fabricated in the method may be micropatterned to a higher degree.

In the method for fabricating a multi-layer flexible printed circuit board of the invention, blind via-holes are used for interlayer connection, and its advantage is that the multi-layer flexible printed circuit board thus fabricated in the method may have much better bonding reliability.

In the method for fabricating a laminated multi-layer flexible printed circuit board of the invention, multi-layer flexible printed circuit boards having high bonding reliability and having finely-micropatterned circuit layers are laminated, and its advantage is that the laminated multi-layer flexible printed circuit board thus fabricated in the method also has good bonding reliability and has finely-micropatterned circuit layers.

In the method for fabricating a multi-layer flexible printed circuit board of the invention, a resin ball is used for the core of the conductor for interlayer connection, and its advantage is that the multi-layer flexible printed circuit board thus fabricated in the method may have further enhanced bonding reliability.

Some embodiments of the invention are described hereinunder with reference to FIG. 5 to FIG. 8 attached hereto. In these drawings, the same member is designated by the same reference numeral, and redundant descriptions are omitted. The data as referred to in the embodiments are to indicate examples of all and various possible cases, and should not be limitative.

Embodiment 2

One embodiment of the multi-layer FPC of the invention is described below.

Figure 5:
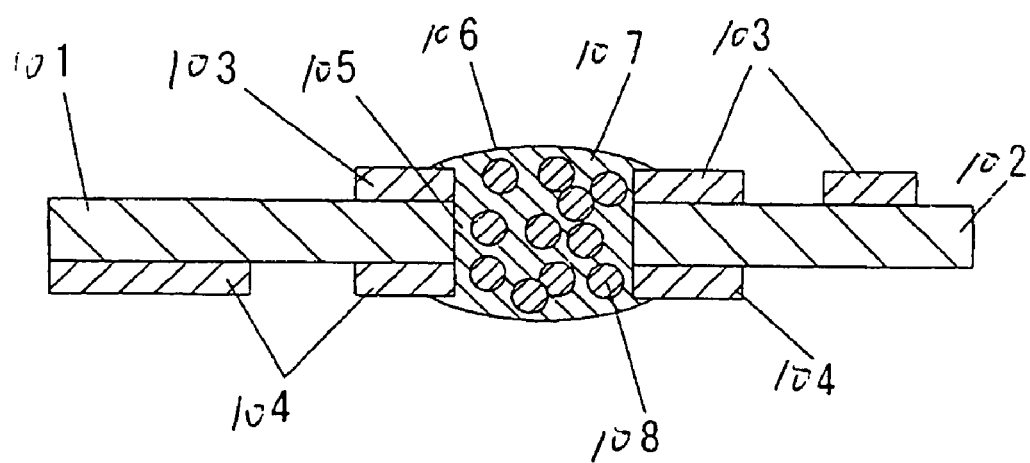
FIG. 5 is a cross-sectional view of an essential part of one embodiment of the multi-layer FPC of the invention.

FIG. 5 is referred to for describing the multi-layer FPC of the invention. FIG. 5 is a cross-sectional view showing an essential part of one embodiment of the multi-layer FPC of the invention.

In FIG. 5, 101 is a multi-layer FPC having an upper circuit layer 103 and a lower circuit layer 104 formed on both faces of an insulating layer of a polyimide film, in which the circuit layers are interconnected to each other via a conductor 6 filled inside the through-hole 105. 107 is solder, and 108 is different metal particles. The different metal particles 108 are metal particles differing from the solder composition.

The conductor 106 contains different metal particles 108 inside the solder 107. The solder composition of the solder 107 may be any of eutectic solder, high-temperature solder, lead-free solder or the like, and any of these is favorable to the invention and may be used herein in any desired manner. The different metal particles 108 may be any of copper particles, nickel particles, iron particles, gold particles, silver particles or the like, or may be composite particles of these. These may be suitably selected for the metal particles for optimization of the thermal expansion coefficient of the conductor.

The metal that differs from the solder composition is described. When the essential component of the solder composition is an alloy, then one metal to constitute the alloy shall be the metal that differs from the solder composition in the invention. For example, when the solder is an Sn—Cu alloy, then Cu particles are defined as the metal particles that differ from the solder composition. In other words, this means that the alloy and the single metal to constitute it shall differ from each other. In addition, when the solder is an Sn—Cu alloy, then Cu—Al alloy particles naturally differ from the solder composition. However, even when the single metal to constitute the alloys for the solder and the metal particles is common to them, it is needless to say that the two differ from each other.

As in FIG. 5, the conductor 106 that participates in the interconnection in the multi-layer FPC 101 is so designed that it has different metal particles 108 inside it. The solder 107 contains the different metal particles 108 inside it, and the thermal expansion coefficient of the conductor 106 is therefore lowered to the level of the thermal expansion coefficient of the insulating layer 102. This solves the problem that has heretofore been most difficult to solve in the art of using solder for interlayer connection in that, when the conductor of solder alone is heated, then the solder in through-holes expands more than the insulating layer and the circuit layer on the surface of the insulating layer peels from the solder at the bonding interface between the two, and therefore the device could not ensure bonding reliability to heat. To that effect, the structure of the invention ensures high bonding reliability of the device.

In place of the different metal particles 108, resin particles may also be used. This could not lower the thermal expansion coefficient of the conductor 106, but is effective for lowering the Young's modulus of the conductor 106. Accordingly, the conductor 106 can relieve the stress that may be caused by the thermal expansion difference between the insulating layer 102 and the conductor 106, and therefore this structure ensures high bonding reliability of the device.

Different metal particles 108 may be combined with resin particles. In this case, the amount of the two to be added to the solder 107 may be suitably controlled so as to lower the thermal expansion coefficient of the conductor 106 to the level of the thermal expansion coefficient of the insulating layer 102, and, in addition, the Young's modulus of the conductor 106 may be exactly controlled.

Figure 6:
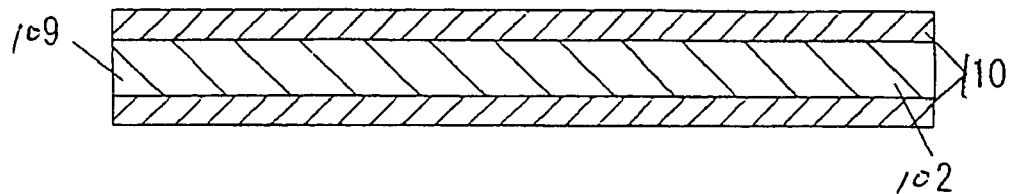
FIG. 6(a) is a cross-sectional view of an essential part of a copper-duplicated laminate plate that serves as a starting material in one embodiment of the invention; (b) is a cross-sectional view of an essential part of a double-printed circuit board having a printed circuit layer on both faces thereof in one embodiment of the invention; (c) is a cross-sectional view of an essential part of the double-printed circuit board having a through-hole formed therein in one embodiment of the invention; (d) is a cross-sectional view of an essential part of the double-printed circuit board where the through-hole is filled with a composite paste in one embodiment of the invention; (e) is a cross-sectional view of an essential part of a multi-layered FPC after interlayer connection in one embodiment of the invention.
Figure 6:
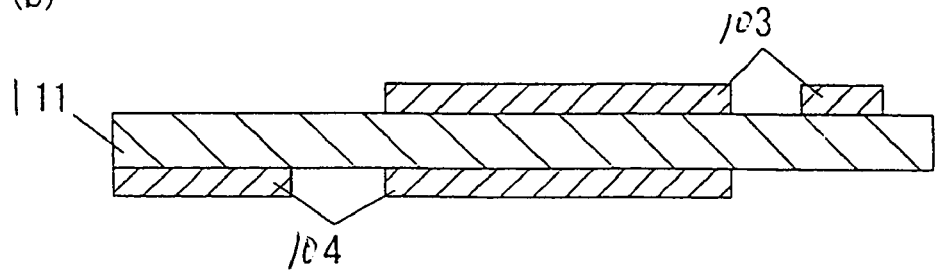
Figure 6:
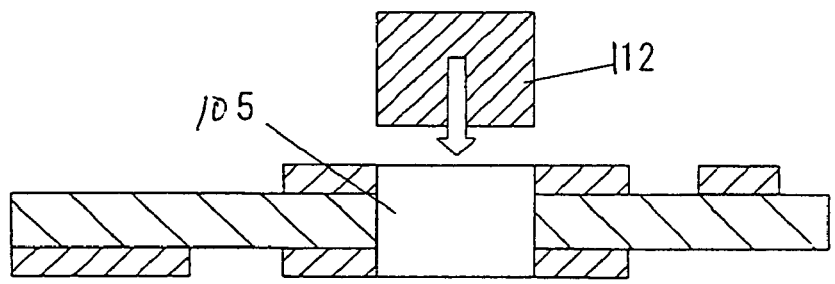
Figure 6:
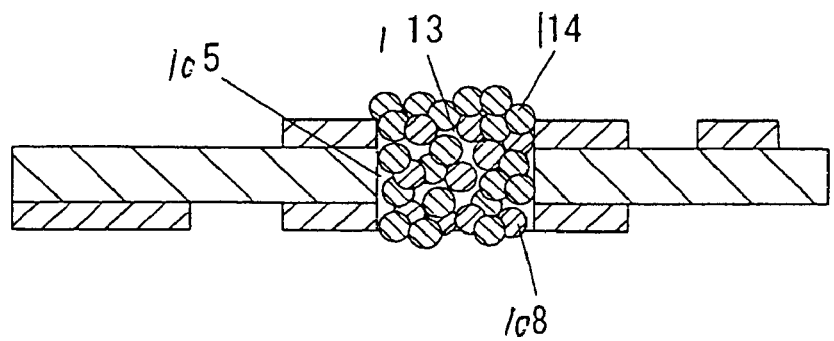
Figure 6:
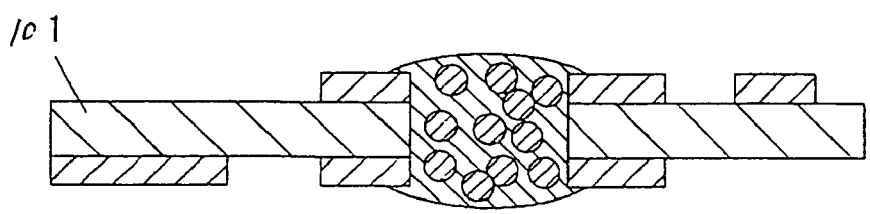
Figure 7:
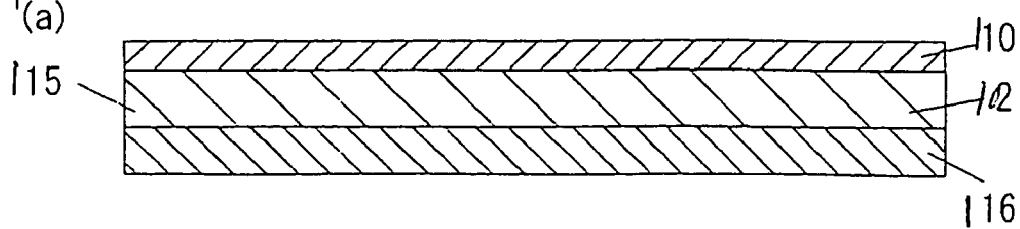
FIG. 7(a) is a cross-sectional view of an essential part of an adhesive layer-lined, copper single-sided laminate plate that serves as a starting material in another embodiment of the invention; (b) is a cross-sectional view of an essential part of an adhesive layer-lined, single-printed circuit board having a printed circuit layer on one face thereof in the second embodiment of the invention; (c) is a cross-sectional view of an essential part of the adhesive layer-lined, single-printed circuit board having a through formed therein in the second embodiment of the invention; (d) is a cross-sectional view of an essential part of a laminated circuit board having a blind via-hole formed therein in the second embodiment of the invention; (e) is a cross-sectional view of an essential part of a multi-layered FPC after interlayer connection in the second embodiment of the invention.
Figure 7:
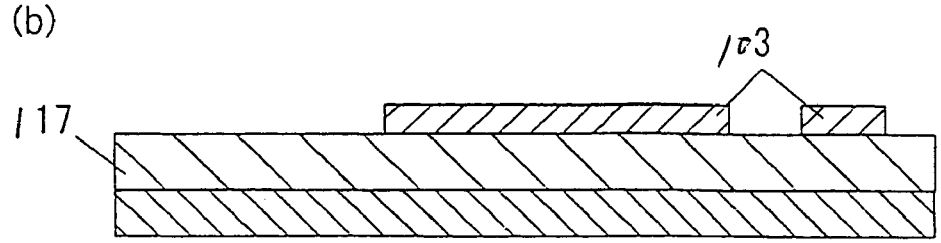
Figure 7:
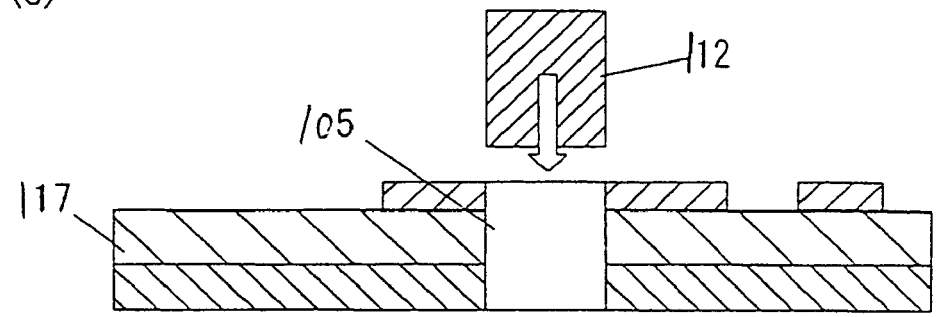
Figure 7:
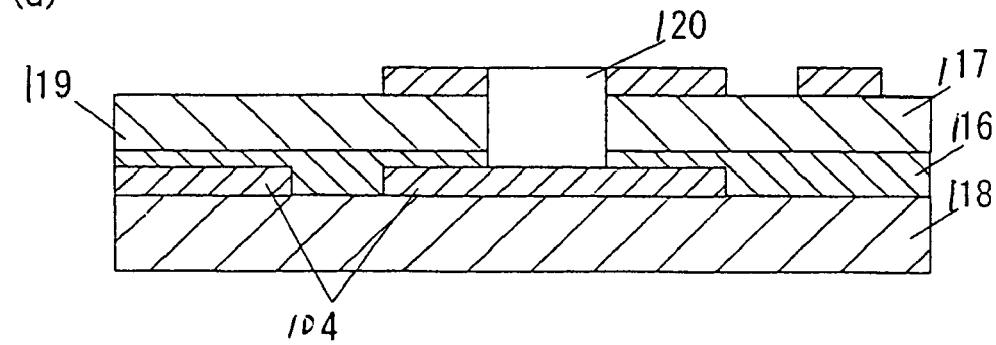
Figure 7:
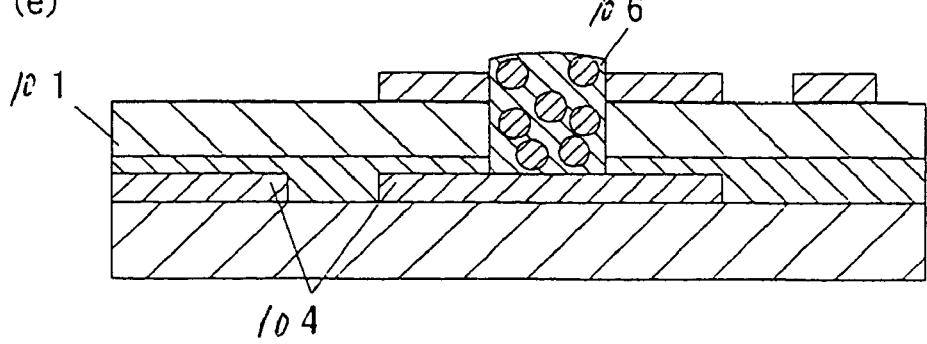
Figure 8:
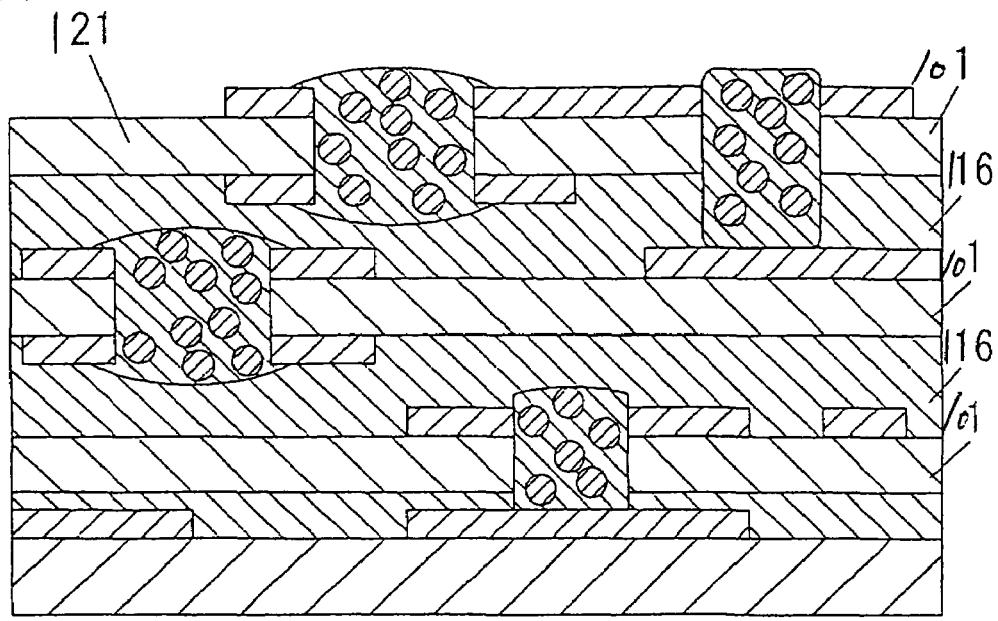
FIG. 8(a) is a cross-sectional view of an essential part of one embodiment of a laminated, multi-layer FPC of the invention; (b) is a cross-sectional view of an essential part of another embodiment of a laminated, multi-layer FPC of the invention.
Figure 8:
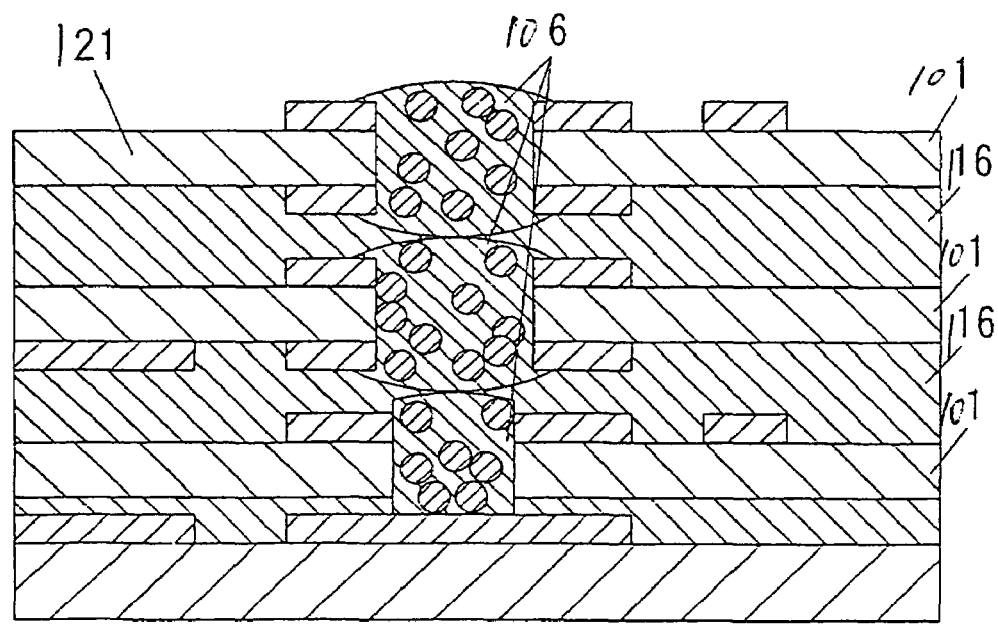

A method for fabricating the multi-layer FPC that comprises such different metal particles and has such high bonding reliability is described in more detail with reference to FIG. 6, FIG. 7 and FIG. 8. In FIG. 6, FIG. 7 and FIG. 8, the same reference numerals as in FIG. 5 are basically the same also in those, and their description is omitted herein.

One embodiment of the method for fabricating the multi-layer FPC of the invention is described with reference to FIG. 6. FIG. 6(a) is a cross-sectional view of an essential part of a copper-duplicated laminate plate that serves as a starting material in one embodiment of the invention; FIG. 6(b) is a cross-sectional view of an essential part of a double-printed circuit board having a printed circuit layer on both faces thereof in one embodiment of the invention; FIG. 6(c) is a cross-sectional view of an essential part of the double-printed circuit board having a through-hole formed therein in one embodiment of the invention; FIG. 6(d) is a cross-sectional view of an essential part of the double-printed circuit board where the through-hole is filled with a composite paste in one embodiment of the invention; and FIG. 6(e) is a cross-sectional view of an essential part of a multi-layered FPC after interlayer connection in one embodiment of the invention.

In FIG. 6, 109 is a copper-duplicated laminate plate with copper foil 110 directly formed on both faces of an insulating layer 102. 111 is a double-printed circuit board having a circuit layer formed on both faces thereof through etching treatment of the copper-duplicated laminate plate 109. 112 is a punching die for forming a through-hole; and 113 is a composite paste comprising solder particles 114 and different metal particles 108.

First as in FIG. 6(a), a copper-duplicated laminate plate 109 is prepared, which has copper foil 110 directly formed on both faces of an insulating layer 102. This embodiment of the invention is a two-layered structure with no adhesive layer formed between the insulating layer 102 and the copper foil 110. Apart from it, the invention may also apply to a three-layered structure having an adhesive layer between the two layers. Any of these structures may be suitably selected in any desired manner, and the invention should not be limited to these.

Next, a mask is formed on the surface of the copper foil 110, which is then etched with an etchant for copper, such as iron chloride, copper chloride or the like to thereby form the upper circuit layer 103 and the lower circuit layer 104, as in FIG. 6(b). The circuit layers thus formed in this step are not influenced at all by the subsequent steps. Accordingly, in this embodiment of fabricating the multi-layer FPC of the invention, the circuit layer may be micropatterned as fine as possible by thinning the copper foil 110 in this step.

Next as in FIG. 6(c), a through-hole 105 is formed by punching with a punching die 112; and as in FIG. 6(d), a composite paste 113 comprising solder particles 114 and different metal particles 108 is filled into the through-hole 105, for example, according to a screen printing process. In this embodiment, the composite paste used comprises solder particles and different metal particles. In place of it, however, a composite paste comprising solder particles and resin particles may also be used to attain high bonding reliability. Any of these modes may be suitably selected and employed in the invention, to which, however, the invention should not be limited.

If desired, the resin particles may be surface-treated, for example, by plating them so as to stably ensure the wettability thereof with solder.

Last, the conductor 106 is fused under heat and solidified whereby the solder particles 114 are fused and solidified to give the interlayer-connected, multi-layer FPC 101, as in FIG. 6(e). The process of fabricating it is extremely simple.

The embodiment of the method for fabricating the multi-layer FPC of the invention mentioned above is characterized by the following: Since the conductor for interlayer connection contains different metal particles, it ensures high bonding reliability. In addition, since the interlayer connection is attained after the formation of the circuit layers, the process of fabricating the device has no influence on the circuit layers. Therefore, the process is favorable for micropatterning of the circuit layers in any desired manner. Last, since the composite paste that comprises solder particles and different metal particles is used for the interlayer bonding material in the process, an extremely simple operation of filling the paste into through-holes, for example, in a mode of screen printing, followed by fusing it therein enables the intended interlayer connection. The number of the necessary steps for the interlayer connection in this method may be reduced as compared with that in any other interconnection methods, and the productivity of the method of the invention is significantly improved. Accordingly, the invention provides an interlayer-connected, multi-layer FPC having high bonding reliability and is most suitable for micropatterning the circuit layers in the device, and the productivity in the method for fabricating the device is high.

Another embodiment of the method for fabricating the multi-layer FPC of the invention is described below, with reference to FIG. 7. This also has the advantages of bonding reliability and micropatterning of circuit layers. FIG. 7(a) is a cross-sectional view of an essential part of an adhesive layer-lined, copper single-sided laminate plate that serves as a starting material in the second embodiment of the invention; FIG. 7(b) is a cross-sectional view of an essential part of an adhesive layer-lined, single-printed circuit board having a printed circuit layer on one face thereof in the second embodiment of the invention; FIG. 7(c) is a cross-sectional view of an essential part of the adhesive layer-lined, single-printed circuit board having a though-hole formed therein in the second embodiment of the invention; FIG. 7(d) is a cross-sectional view of an essential part of a laminated circuit board having a blind via-hole formed therein; and FIG. 7(e) is a cross-sectional view of an essential part of a multi-layered FPC after interlayer connection in the second embodiment of the invention.

In FIG. 7, 115 is an adhesive layer-lined, copper single-sided laminate plate having copper foil 110 formed one face of an insulating layer 102 and having an adhesive layer 116 formed on the other face thereof. 117 is an adhesive layer-lined, single-printed circuit board having an upper circuit layer 103 formed on one face thereof through etching treatment of the adhesive layer-lined, copper single-sided laminate plate 113. 118 is another single-printed circuit board that is to be laminated with the adhesive layer-lined, single-printed circuit board 117. 119 is a laminated circuit board formed by laminating the adhesive layer-lined, single-printed circuit boards 117 and the other single-printed circuit board 118, followed by forming a blind via-hole 120 in the resulting laminate structure for interlayer connection through it.

First as in FIG. 7(a), an adhesive layer-lined, copper single-sided laminate plate 115 is prepared, which has copper foil 110 directly formed on one face of an insulating layer 102, and has an adhesive layer 116 formed on the other face thereof. This is etched to form an upper circuit layer 103 thereon, and an adhesive layer-lined, single-printed circuit board 117 is formed, as in FIG. 7(b). As compared with the circuit layer in the double-printed circuit board in the former embodiment as above, the upper circuit layer 103 in the adhesive layer-lined, single-printed circuit board 117 in this second embodiment may be micropatterned more finely since it accepts single-face etching that is more suitable for micropatterning to give circuits.

The reason is described below. In forming circuit layers of a double-printed circuit board, the copper foil existing on both faces of a copper-duplicated laminate plate is etched both at a time, and therefore, an etchant must be uniformly and evenly applied to both faces of the copper-duplicated laminate plate in the upward and downward two directions. However, when an etchant is sprayed under pressure onto both faces of a copper-duplicated laminate plate in the upward and downward two directions, then the etchant having been sprayed onto the upper face may remain as such thereon therefore causing a problem in that the etching uniformity could not be ensured. Accordingly, the etching condition for such double-printed circuit boards is unstable, and it will be difficult to form extremely finely-micropatterned circuit layers in these circuit boards. On the other hand, in forming a circuit layer of a single-printed circuit board, an etchant may be sprayed onto a single-sided plate only in the upward direction, and therefore no etchant may remain on the plate. Accordingly, the optimal range of the etching condition for it may be broadened, and it is favorable for finely micropatterning the circuit layer on the single-printed circuit board.

Next as in FIG. 7(c), a through-hole 105 is formed in the adhesive layer-lined, single-printed circuit board 117 by punching it with a punching die 112; and as in FIG. 7(d), the adhesive layer-lined, single-printed circuit board 117 is laminated with another single-printed circuit board 118 with a lower circuit layer 104 formed thereon, via the adhesive layer 116 therebetween to thereby construct a laminated circuit board 119 having a blind via-hole 120 formed therein for interlayer connection. Thus constructed, the laminated circuit board 119 has the single-printed circuit boards 117 and 118 each having the finely-micropatterned circuit layer thereon. Therefore, as compared with the circuit layers of the double-printed circuit board in the former embodiment mentioned above, the circuit layers of the single-printed circuit board of this embodiment may be much more finely micropatterned. In this embodiment of laminating the single-printed circuit boards as illustrated herein, the laminated circuit board 119 is used. Not limited to it and in place of it, however, a double-printed circuit board may be constructed by bonding two single-printed circuit boards to each other in such a manner that the circuit layer could be the outermost layer, and it may be further processed to form through-holes therein. According to the method, the circuit layers may also be micropatterned as fine as possible. In the invention, any of these lamination methods may be employed in any desired manner, and needless-to-say, the invention should not be limited to these.

Last as in FIG. 7(*e*), a composite paste comprising solder particles and different metal particles is filled into the blind via-hole 120 and fused therein for interlayer connection to give the intended multi-layer FPC 101 in which the circuit layers are extremely finely micropatterned. The conductor 106 for interlayer connection is filled inside the blind via-hole 120 that is bottomed with the underlying lower circuit layer 104. Therefore, as compared with the former embodiment having a through-hole as above, the bonding area between the conductor and the circuit layer is increased in this embodiment, and the bonding strength between the two is therefore increased. Accordingly, even when various external stress is given to the circuit board of this embodiment, the circuit layer does not peel from the conductor at the bonding interface between the two, and the device ensures further better bonding reliability.

In the second embodiment of fabricating the multi-layer FPC of the invention, single-printed circuit boards are laminated. In this, therefore, the circuit layers may be micropatterned more finely, as compared with those in the other embodiment mentioned hereinabove of forming double-printed circuit boards. In addition, since the conductor is filled into the blind via-holes in this embodiment, it ensures further better bonding reliability as compared with the other embodiment where the conductor is filled into through-holes. Accordingly, the second embodiment of the invention also provides an interlayer-connected, multi-layer FPC having high bonding reliability and is most suitable for micropatterning the circuit layers in the device, and the productivity in the method for fabricating the device is high.

Still another embodiment of the invention of further laminating the multi-layer FPCs fabricated previously is described below with reference to FIG. 8. This is to give laminate-structured, multi-layer FPC. FIG. 8(*a*) is a cross-sectional view of an essential part of one embodiment of the laminated, multi-layer FPC of the invention; and FIG. 8(*b*) is a cross-sectional view of an essential part of another embodiment of the laminated, multi-layer FPC of the invention.

In FIG. 8, 121 is a laminated multi-layer FPC fabricated by laminating multi-layer FPCs 101 via an adhesive layer 116 therebetween.

As in FIG. 8(*a*), the multi-layer FPCs 101 fabricated according to any of the embodiments of the invention mentioned hereinabove are laminated via an adhesive layer 116 therebetween to give a multi-layer FPC 121 in which the number of the circuit layers is increased. In the multi-layer FPC 121 thus constructed, the constitutive multi-layer FPCs 101 all have good bonding reliability and finely-micropatterned circuit layers. Therefore, the multi-layer FPC 121 also has high bonding reliability and has finely-micropatterned circuit layers.

As in FIG. 8(*b*), the multi-layer FPCs 101 may be laminated in such a manner that the conductor 106 of one multi-layer FPC is kept in contact with that of the other multi-layer FPC, to construct a multi-layer FPC 121. Since the surface of the conductor 106 is solder, the solder may fuse and solidify when the conductors 106 are heated and cooled while they are kept in contact with each other, and as a result, the conductors 106 are readily bonded to each other.

The laminated, multi-layer FPCs of these embodiments of the invention are constructed by laminating the multi-layer FPCs fabricated in the other embodiments of the invention mentioned hereinabove. In these, the constitutive circuit boards have good bonding reliability and have finely-micropatterned circuit layers. Therefore, the laminated, multi-layer FPCs of the invention also have good bonding reliability and have finely-micropatterned circuit layers. Moreover, since the conductor of the constitutive multi-layer FPCs directly participates in interlayer connection of the circuit boards in constructing the laminated, multi-layer FPCs, not requiring any additional interlayer-connecting material, the productivity of the laminated, multi-layer FPCs is high. Accordingly, the invention also provides a laminated, interlayer-connected, multi-layer FPC having high bonding reliability and is most suitable for micropatterning the circuit layers in the device, and the productivity in the method for fabricating the device is high.

The invention provides an interlayer-connected, multi-layer flexible printed circuit board having high bonding reliability and most suitable for micropatterning the circuit layers in the device, and provides a high-productivity method for fabricating the device.

In the multi-layer flexible printed circuit board of the invention, a composite that comprises solder and different metal particles is used for the conductor for interlayer connection, and its advantage is that the thermal expansion coefficient of the conductor may be optimized and the device ensures good bonding reliability.

In the multi-layer flexible printed circuit board of the invention, a composite that comprises solder and different metal particles inside the solder is used for the conductor for interlayer connection, and its advantage is that the thermal expansion coefficient of the conductor may be optimized, the solder bonding is good, and the device ensures good bonding reliability.

In the multi-layer flexible printed circuit board of the invention, a composite that comprises solder and resin particles is used for the conductor for interlayer connection, and its advantage is that the Young's modulus of the conductor may be optimized and the device ensures good bonding reliability.

In the multi-layer flexible printed circuit board of the invention, a composite that comprises solder and resin particles inside the solder is used for the conductor for interlayer connection, and its advantage is that the Young's modulus of the conductor may be optimized, the solder bonding is good, and the device ensures good bonding reliability.

In the multi-layer flexible printed circuit board of the invention, a composite that comprises solder, different metal particles and resin particles is used for the conductor for interlayer connection, and its advantage is that the thermal expansion coefficient and the Young's modulus of the conductor may be optimized, and the device ensures much better bonding reliability.

In the multi-layer flexible printed circuit board of the invention, a composite that comprises solder, and different metal particles and resin particles inside the solder is used for the conductor for interlayer connection, and its advantage is that the thermal expansion coefficient and the Young's modulus of the conductor may be optimized, the solder bonding is good, and the device ensures much better bonding reliability.

According to the method for fabricating a multi-layer flexible printed circuit board of the invention, interlayer connection is attained in an extremely simple process, and its advantage is that a multi-layer flexible printed circuit board having finely-micropatterned circuit layers can be fabricated at high productivity.

In the method for fabricating a multi-layer flexible printed circuit board of the invention, single-printed circuit boards each having an extremely finely-micropatterned circuit layer are processed, and its advantage is that the printed circuit layers on the double-printed circuit board thus fabricated in the method may be micropatterned to a higher degree.

In the method for fabricating a multi-layer flexible printed circuit board of the invention, blind via-holes are used for interlayer connection, and its advantage is that the multi-layer flexible printed circuit board thus fabricated in the method may have much better bonding reliability.

In the method for fabricating a laminated multi-layer flexible printed circuit board of the invention, multi-layer flexible printed circuit boards having high bonding reliability and having finely-micropatterned circuit layers are laminated, and its advantage is that the laminated multi-layer flexible printed circuit board thus fabricated in the method also has good bonding reliability and has finely-micropatterned circuit layers.

The invention provides an interlayer-connected, multi-layer flexible printed circuit board having high bonding reliability and most suitable for micropatterning the circuit layers in the device, and provides a high-productivity method for fabricating the device.

This application is based upon and claims the benefit of priority of Japanese Patent Application No2003-197577 filed on 2003 Jul. 16 and Japanese Patent Application No2003-368668 filed on 2003 Oct. 29, the contents of which are incorporated herein by references in its entirety.

What is claimed is:

1. A method for fabricating a printed circuit board, comprising the steps of:
   forming a through-hole in an interconnection site of a printed circuit board having first and second printed circuit layers formed on both faces of an insulating layer in such a manner that the through-hole passes through the first and second printed circuit layers and the insulating layer;
   inserting a conductive ball with a core and solder integrally formed around the core into the through-hole; and
   fusing the solder of the conductive ball in the through-hole to fill a space between the conductive ball and the through hole and thereby provide interconnection between the first circuit layer and the second circuit layer, wherein the printed circuit board is formed by bonding two single printed circuit boards each having a printed circuit layer formed on one face of an insulating layer, via an adhesive layer therebetween in such a manner that one of the circuit layers is the outermost layer.

2. A method for fabricating a printed circuit board, comprising:
   (a) preparing a first printed circuit board and a second printed circuit board each having a printed circuit layer formed on one face of an insulating layer;
   (b) forming a through-hole in an interconnection site of the first printed circuit board in such a manner that the through-hole passes through the printed circuit layer and the insulating layer of the first printed circuit board;
   (c) laminating the first printed circuit board processed in steps (a) and (b) on the printed circuit layer of the second printed circuit board in such a manner that the printed circuit layer of the first printed circuit board is the outermost layer, via an adhesive layer between the first printed circuit board and the printed circuit layer of the second printed circuit board, to provide a laminate structure, whereby a blind via-hole is provided in the laminate structure;
   (d) then inserting a conductive ball with a core and solder integrally formed around the core into the blind via-hole; and
   (e) fusing the solder of the conductive ball in the blind via-hole to fill a space between the conductive ball and the through hole and thereby provide interconnection between the printed circuit layer of the first printed circuit board and the printed circuit layer of the second printed circuit board.

3. A method for fabricating a printed circuit board, comprising the steps of:
   forming a through-hole in an interconnection site of a printed circuit board having first and second printed circuit layers formed on both faces of an insulating layer in such a manner that the through-hole passes through the first and second printed circuit layers and the insulating layer;
   inserting a conductive ball with a core and solder integrally formed around the core into the through-hole; and
   fusing the solder of the conductive ball in the through-hole to fill a space between the conductive ball and the through hole and thereby provide interconnection between the first circuit layer and the second circuit layer, wherein a plurality of the printed circuit boards are laminated via an adhesive layer therebetween.

4. A method for fabricating a printed circuit board, comprising the steps of:
   forming a through-hole in an interconnection site of a printed circuit board having first and second printed circuit layers formed on both faces of an insulating layer in such a manner that the through-hole passes through the first and second printed circuit layers and the insulating layer;
   inserting a conductive ball with a core and solder integrally formed around the core into the through-hole; and
   fusing the solder of the conductive ball in the through-hole to fill a space between the conductive ball and the through hole and thereby provide interconnection between the first circuit layer and the second circuit layer, wherein the core is made from resin.

* * * * *